United States Patent
Uemichi

(10) Patent No.: US 12,266,838 B2
(45) Date of Patent: Apr. 1, 2025

(54) DIGITAL PHASE SHIFT CIRCUIT AND DIGITAL PHASE SHIFTER

(71) Applicant: Fujikura Ltd., Tokyo (JP)

(72) Inventor: Yusuke Uemichi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 18/018,361

(22) PCT Filed: Aug. 10, 2022

(86) PCT No.: PCT/JP2022/030581
§ 371 (c)(1),
(2) Date: Jan. 27, 2023

(87) PCT Pub. No.: WO2023/119717
PCT Pub. Date: Jun. 29, 2023

(65) Prior Publication Data
US 2024/0258670 A1    Aug. 1, 2024

(30) Foreign Application Priority Data
Dec. 24, 2021    (JP) ................ 2021-211348

(51) Int. Cl.
*H01P 1/18* (2006.01)
*H01Q 3/38* (2006.01)
*H03H 11/16* (2006.01)

(52) U.S. Cl.
CPC ............. *H01P 1/184* (2013.01); *H01Q 3/38* (2013.01); *H03H 11/16* (2013.01)

(58) Field of Classification Search
CPC .. H01P 1/18; H01P 1/184; H01Q 3/38; H03H 11/16; H03H 11/20
(Continued)

(56) References Cited

U.S. PATENT DOCUMENTS 6,816,031 B1    11/2004  Miller
10,009,202 B1 *  6/2018  Valdes Garcia ........ H04L 27/22
(Continued)

FOREIGN PATENT DOCUMENTS

CN    106785250 A    5/2017
CN    109616723 A    4/2019
(Continued)

OTHER PUBLICATIONS

W/Japanese International Search Report dated Oct. 18, 2022, issued in counterpart International Application No. PCT/JP2022/030581. (3 pages).
(Continued)

*Primary Examiner* — William Hernandez
(74) *Attorney, Agent, or Firm* — WHDA, LLP

(57) ABSTRACT

A digital phase shift circuit includes: a signal line extending in a predetermined direction; two inner lines disposed on both one side and another side of the signal line and separated a predetermined distance from the signal line; two outer lines provided at positions which are farther from the signal line than the inner lines on both the one side and the other side; a first grounding conductor electrically connected to one end of each of the inner lines and the outer lines; and a second grounding conductor electrically connected to other ends of the outer lines, and the predetermined distance is set to be less than 10 μm.

8 Claims, 8 Drawing Sheets

(58) Field of Classification Search
USPC .......................................................... 327/231
See application file for complete search history.

(56) References Cited

U.S. PATENT DOCUMENTS

| | | | |
|---|---|---|---|
| 10,291,282 B1* | 5/2019 | Lin | H04B 1/52 |
| 2013/0249653 A1 | 9/2013 | Ferrari et al. | |
| 2014/0312986 A1 | 10/2014 | Edelstein et al. | |
| 2019/0157754 A1* | 5/2019 | Valdes Garcia | H04B 1/00 |
| 2019/0158068 A1* | 5/2019 | Valdes Garcia | H01Q 21/245 |
| 2020/0118781 A1* | 4/2020 | Wang | H04B 10/548 |
| 2022/0131247 A1* | 4/2022 | Li | H01P 11/00 |
| 2023/0170851 A1* | 6/2023 | Waks | H01P 1/227 |
| | | | 330/149 |

FOREIGN PATENT DOCUMENTS

| | | |
|---|---|---|
| CN | 111326839 A | 6/2020 |
| JP | 2011-259215 A | 12/2011 |
| JP | 2016-158035 A | 9/2016 |

OTHER PUBLICATIONS

Tousi et al., "A Ka-band Digitally-Controlled Phase Shifter with sub-degree Phase Precision", 2016 IEEE Radio Frequency Integrated Circuits Symposium, pp. 356-359. Cited in Specification. (4 pages).
Sadhu Bodhisatwa et al., "A 28-GHz 32-Element TRX Phased-Array IC With Concurrent Dual-Polarized Operation and Orthogonal Phase and Gain Control for 5G Communications", IEEE Journal of Solid-State Circuits, IEEE, USA, vol. 52, No. 12, Dec. 1, 2017 (Dec. 1, 2017), pp. 3373-3391; cited in European Search Report dated Mar. 4, 2024.

* cited by examiner

DIGITAL PHASE SHIFT CIRCUIT AND DIGITAL PHASE SHIFTER

TECHNICAL FIELD

The present invention relates to a digital phase shift circuit and a digital phase shifter.

Priority is claimed on Japanese Patent Application No. 2021-211348, filed Dec. 24, 2021, the content of which is incorporated herein by reference.

BACKGROUND ART

A digital-controlled phase shift circuit (a digital phase shift circuit) for a high-frequency signal such as microwaves, submillimeter waves, or millimeter waves has been disclosed (for example, see Non-Patent Document 1). The digital phase shift circuit includes a signal line, inner lines, outer lines, a first grounding conductor, a second grounding conductor, a first electronic switch, a second electronic switch, and a capacitor.

The signal line is disposed to extend in a predetermined direction. The inner lines are disposed on one side and the other side of the signal line and are separated 10 μm from the signal line. The outer lines are provided at positions farther from the signal line than the inner lines on the one side and the other side of the signal line. The first grounding conductor is electrically connected to one end of each of the inner lines and the outer lines. The second grounding conductor is electrically connected to other ends of the outer lines.

The first electronic switch is connected between the other end of the inner line on the one side and the second grounding conductor. The second electronic switch is connected between the other end of the inner line on the other side and the second grounding conductor. The capacitor is connected between the signal line and the second grounding conductor.

PRIOR ART DOCUMENT

Non-Patent Document

[Non-Patent Literature 1] A Ka-band Digitally-Controlled Phase Shifter with sub-degree Phase Precision (2016, IEEE, RFIC)

DISCLOSURE OF INVENTION

Problems to be Solved by the Invention

The inventor of the present invention found that a loss of a high-frequency signal increases as the frequency of the signal increases and the loss of the high-frequency signal is due to the capacitance value of the capacitor in the configuration example according to the related art. Therefore, the inventor of the present invention obtained an idea that a loss of a signal can be decreased by decreasing the capacitance value of the capacitor as much as possible for use in a higher frequency.

A delay amount in the digital phase shift circuit is proportional to the square root of the product of an inductance value and a capacitance value of the digital phase shift circuit. Accordingly, when the capacitance value of the capacitor is decreased, the capacitance value of the digital phase shift circuit decreases and thus a sufficient delay amount may not be able to be obtained.

The present invention was made in consideration of the aforementioned circumstances and an object thereof is to provide a digital phase shift circuit and a digital phase shifter that can decrease a loss of a high-frequency signal while limiting a decrease in delay amount.

Means for Solving the Problems

A first aspect of the present invention is a digital phase shift circuit including; a signal line extending in a predetermined direction; two inner lines disposed on both one side and another side of the signal line and separated a predetermined distance from the signal line; two outer lines provided at positions which are farther from the signal line than the inner lines on both the one side and the other side; a first grounding conductor electrically connected to one end of each of the inner lines and the outer lines; a second grounding conductor electrically connected to other ends of the outer lines; a first electronic switch connected between another end of an inner line of the inner lines on the one side and the second grounding conductor; and a second electronic switch connected between another end of an inner line of the inner lines on the other side and the second grounding conductor, and the predetermined distance is set to be less than 10 μm.

With this configuration, it is possible to decrease a loss of a high-frequency signal while limiting a decrease in delay amount.

In the digital phase shift circuit according to the first aspect of the present invention, the predetermined distance may be set to be equal to or less than 2 μm.

The digital phase shift circuit according to the first aspect of the present invention may include a third electronic switch connected between the signal line and the first grounding conductor or the second grounding conductor.

The digital phase shift circuit according to the first aspect of the present invention may include: a capacitor connected between the signal line and the second grounding conductor, and a fourth electronic switch connected in series to the capacitor, and a size of an upper electrode of the capacitor may be equal to or less than a width of the signal line.

In the digital phase shift circuit according to the first aspect of the present invention, the first electronic switch and the second electronic switch may be field-effect transistors, and a size of each of the field-effect transistors may be equal to or greater than a length obtained by summing a width of the first grounding conductor and a width of the second grounding conductor.

In the digital phase shift circuit according to the first aspect of the present invention, parts of both or one of the first grounding conductor and the second grounding conductor, which correspond to areas between the outer lines and the inner lines, may be formed in a multi-layered structure.

In the digital phase shift circuit according to the first aspect of the present invention, the signal line may be formed in a first conductive layer, and the inner lines may be formed in a second conductive layer facing the first conductive layer with an insulating layer interposed therebetween.

A second aspect of the present invention is a digital phase shifter including: a plurality of the digital phase shift circuits described above connected in a cascade manner, and a signal in a frequency band from a first frequency to a second frequency higher than the first frequency is shifted in phase by the plurality of digital phase shift circuits connected in a cascade manner. Each of the plurality of digital phase shift circuits operates in either one operation mode of a low-delay mode in which the first electronic switch and the second electronic switch are set to a closed state and a high-delay mode in which the first electronic switch and the second electronic switch are set to an open state, and a magnitude relationship of the signal varying according to a control state of operation modes of the plurality of digital phase shift circuits differs between when a frequency of the signal is the first frequency and when the frequency of the signal is the second frequency.

A third aspect of the present invention is a digital phase shifter including: a plurality of the digital phase shift circuits described above connected in a cascade manner, and a signal in a frequency band from a first frequency to a second frequency higher than the first frequency is shifted in phase by the plurality of digital phase shift circuits connected in a cascade manner. Each of the plurality of digital phase shift circuits operates in either one operation mode of a low-delay mode in which the first electronic switch and the second electronic switch are set to a closed state and a high-delay mode in which the first electronic switch and the second electronic switch are set to an open state, and a magnitude relationship between an amplitude of the signal when all the plurality of digital phase shift circuits are in the low-delay mode and an amplitude of the signal when all the plurality of digital phase shift circuits are in the high-delay mode differs between when a frequency of the signal is the first frequency and when the frequency of the signal is the second frequency.

Effects of the Invention

As described above, according to the present invention, it is possible to provide a digital phase shift circuit and a digital phase shifter that can decrease a loss of a high-frequency signal while limiting a decrease in delay amount.

EMBODIMENTS FOR CARRYING OUT THE INVENTION

Figure 1:
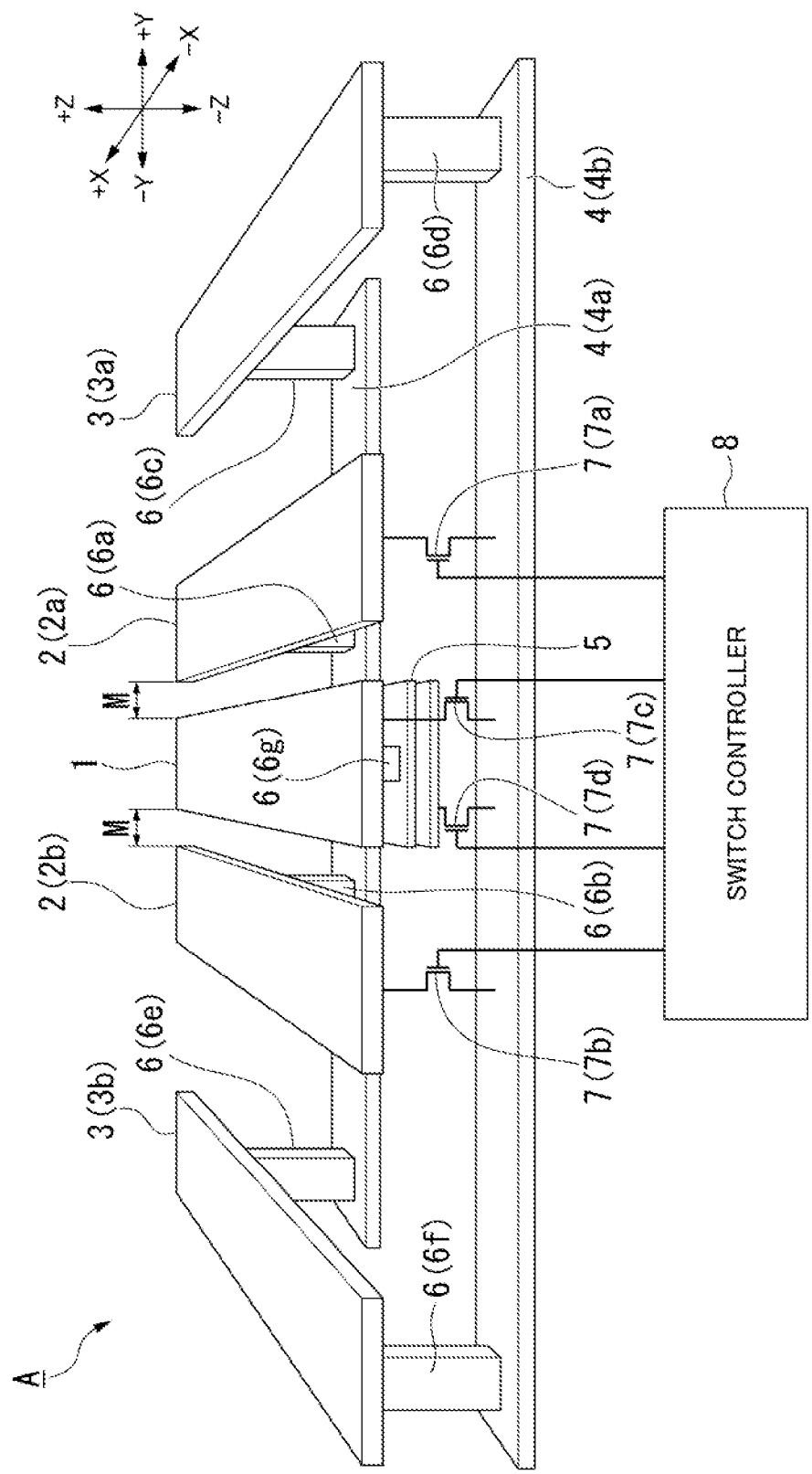
FIG. 1 is a perspective view of a digital phase shift circuit according to an embodiment.

Hereinafter, a digital phase shift circuit according to an embodiment will be described with reference to the accompanying drawings. Shapes, sizes, and the like of components in the drawings may be exaggerated for the purpose of clearer description.

FIG. 1 is a perspective view of a digital phase shift circuit according to an embodiment. As shown in FIG. 1, a digital phase shift circuit A according to this embodiment includes a signal line 1, two inner lines 2 (a first inner line 2a and a second inner line 2b), two outer lines 3 (a first outer line 3a and a second outer line 3b), two grounding conductors 4 (a first grounding conductor 4a and a second grounding conductor 4b), a capacitor 5, a plurality of connection conductors 6, four electronic switches 7 (a first electronic switch 7a, a second electronic switch 7b, a third electronic switch 7c, and a fourth electronic switch 7d), and a switch controller 8.

The signal line 1 is a linear strip-shaped conductor that extends in a predetermined direction. That is, the signal line 1 is a long plate-shaped conductor that has a fixed width, a fixed thickness, and a predetermined length. In the example shown in FIG. 1, a signal S flows in the signal line 1 from a near side (a side of the digital phase shift circuit A according to this embodiment on which the capacitor 5 is provided) to a far side which is the opposite side thereto. The signal S is a high-frequency signal in a frequency band of microwaves, submillimeter waves, or millimeter waves.

In FIG. 1, a front-rear direction (that is, a direction parallel to the extending direction of the signal line 1) is defined as an X-axis direction, a right-left direction orthogonal to the front-rear direction is defined as a Y-axis direction, and an up-down direction (vertical direction) orthogonal to both the front-rear direction and the right-left direction is defined as a Z-axis direction. A +X direction is a direction from the near side to the far side in the X-axis direction, and a −X direction is a reverse direction of the +X direction. A +Y direction is a rightward direction in the Y-axis direction, and a −Y direction is a reverse direction of the +Y direction. A +Z direction is an upward direction in the Z-axis direction, and a −Z direction is a reverse direction of the +Z direction.

In this embodiment, the side of the digital phase shift circuit A on which the capacitor 5 is disposed is referred to as the front side, and the opposite side thereof is referred to as the rear side. The side of the digital phase shift circuit A on which the first outer line 3a is disposed is referred to as the right side, and the side thereof on which the second outer line 3b is disposed is referred to as the left side. The side of the digital phase shift circuit A on which the signal line 1 is disposed is referred to as the upper side, and the side thereof on which the grounding conductors 4 are disposed is referred to as the lower side. The actual installation attitude of the digital phase shift circuit A is not limited to the attitude in this embodiment and may be any attitude.

The first inner line 2a is a linear strip-shaped conductor. That is, the first inner line 2a is a long plate-shaped conductor that has a fixed width, a fixed thickness, and a predetermined length. The first inner line 2a extends in the same direction as the extending direction of the signal line 1. The first inner line 2a is provided parallel to the signal line 1 and is separated a predetermined distance M therefrom. Specifically, the first inner line 2a is separated the predetermined distance M from one side of the signal line 1. In other words, the first inner line 2a is separated the predetermined distance M in the +Y direction from the signal line 1.

The second inner line 2b is a linear strip-shaped conductor That is, the second inner line 2b is a long plate-shaped conductor that has a fixed width, a fixed thickness, and a predetermined length similarly to the first inner line 2a. The second inner line 2b extends in the same direction as the extending direction of the signal line 1. The second inner line 2b is provided parallel to the signal line 1 and is separated the predetermined distance M therefrom. Specifically, the second inner line 2b is separated the predetermined distance M from the other side of the signal line 1. In other words, the second inner line 2b is separated the predetermined distance M in the −Y direction from the signal line 1.

The predetermined distance M is set to be less than 10 µm. More preferably, the predetermined distance M is equal to or less than, for example, 2 µm, and it is desired that the inner lines 2 be as close to the signal line 1 as possible. In this embodiment, the inner lines 2 are disposed to approach the signal line 1 by a manufacturing limit or the vicinity of the manufacturing limit.

The first outer line 3a is a linear strip-shaped conductor that is provided at a position farther from the signal line 1 than the first inner line 2a on the one side of the signal line 1. That is, the first outer line 3a is a linear strip-shaped conductor that is disposed in the +Y direction from the first inner line 2a. The first outer line 3a is a long plate-shaped conductor that has a fixed width, a fixed thickness, and a predetermined length. The first outer line 3a is provided parallel to the signal line 1 and is separated a predetermined distance from the signal line 1 with the first inner line 2a interposed therebetween. The first outer line 3a extends in the same direction as the extending direction of the signal line 1 similarly to the first inner line 2a and the second inner line 2b.

The second outer line 3b Is a linear strip-shaped conductor that is provided at a position farther from the signal line 1 than the second inner line 2b on the other side of the signal line 1. That is, the second outer line 3b is a linear strip-shaped conductor that is disposed in the −Y direction from the second inner line 2b. The second outer line 3b is a long plate-shaped conductor that has a fixed width, a fixed thickness, and a predetermined length similarly to the first outer line 3a. The second outer line 3b is provided parallel to the signal line 1 and is separated a predetermined distance from the signal line 1 with the second inner line 2b interposed therebetween. The second outer line 3b extends in the same direction as the extending direction of the signal line 1 similarly to the first inner line 2a and the second inner line 2b.

The first grounding conductor 4a is a linear strip-shaped conductor that is provided at one end side (on the +X direction-side) of each of the first inner line 2a, the second inner line 2b, the first outer line 3a, and the second outer line 3b. The first grounding conductor 4a is electrically connected to the one end of each of the first inner line 2a, the second inner line 2b, the first outer line 3a, and the second outer line 3b. The first grounding conductor 4a is a long plate-shaped conductor that has a fixed width, a fixed thickness, and a predetermined length.

The first grounding conductor 4a is provided orthogonal to the first inner line 2a, the second inner line 2b, the first outer line 3a, and the second outer line 3b which extend in an equal direction. That is, the first grounding conductor 4a is disposed to extend in the Y-axis direction. The first grounding conductor 4a is provided a predetermined distance below the first inner line 2a, the second inner line 2b, the first outer line 3a, and the second outer line 3b.

In the example shown in FIG. 1, the first grounding conductor 4a is set such that one end which is an end in the +Y direction is located substantially at the same position as a right edge of the first outer line 3a. In the example shown in FIG. 1, the first grounding conductor 4a is set such that the other end which is an end in the −Y direction is located substantially at the same position as a left edge of the second outer line 3b.

The second grounding conductor 4b is a linear strip-shaped conductor that is provided at the other end side (on the −X direction-side) of each of the first inner line 2a, the second inner line 2b, the first outer line 3a, and the second outer line 3b. The second grounding conductor 4b is a long plate-shaped conductor that has a fixed width, a fixed thickness, and a predetermined length similarly to the first grounding conductor 4a.

The second grounding conductor 4b is disposed parallel to the first grounding conductor 4a and is provided orthogonal to the first inner line 2a, the second inner line 2b, the first outer line 3a, and the second outer line 3b similarly to the first grounding conductor 4a. The second grounding conductor 4b is provided a predetermined distance below the first inner line 2a, the second inner line 2b, the first outer line 3a, and the second outer line 3b.

The second grounding conductor 4b is set such that one end which is an end in the +Y direction is located substantially at the same position as the right edge of the first outer line 3a. The second grounding conductor 4b is set such that the other end which is an end in the −Y direction is located substantially at the same position as the left edge of the second outer line 3b. In the example shown in FIG. 1, the second grounding conductor 4b is located at the same position in the Y-axis direction as the first grounding conductor 4a.

The capacitor 5 is provided between the signal line 1 and the first grounding conductor 4a or the second grounding conductor 4b. For example, an upper electrode of the capacitor 5 is connected to the signal line 1 and a lower electrode thereof is electrically connected to the fourth electronic switch 7d. For example, the capacitor 5 is a thin-film capacitor with a metal insulator metal (MIM) structure. The capacitor 5 may be a parallel-plate type capacitor or may be an opposed comb-teeth type capacitor (an interdigital capacitor). The capacitance value C of the digital phase shift circuit A includes the capacitance value Ca of the capacitor 5.

The plurality of connection conductors 6 include at least connection conductors 6a to 6f. The connection conductor 6a is a conductor that electrically and mechanically connects the one end of the first inner line 2a and the first grounding conductor 4a. For example, the connection conductor 6a is a conductor extending in the Z-axis direction, one end (an upper end) thereof is connected to the bottom of the first inner line 2a, and the other end (a lower end) thereof is connected to the top of the first grounding conductor 4a.

The connection conductor 6b is a conductor that electrically and mechanically connects the one end of the second inner line 2b and the first grounding conductor 4a. For example, similarly to the connection conductor 6a, the connection conductor 6b is a conductor extending in the Z-axis direction, one end (an upper end) thereof is connected to the bottom of the second inner line 2b, and the other end (a lower end) thereof is connected to the top of the first grounding conductor 4a.

The connection conductor 6c is a conductor that electrically and mechanically connects the one end of the first outer line 3a and the first grounding conductor 4a. For example, the connection conductor 6c is a conductor extending in the Z-axis direction, one end (an upper end) thereof is connected to the bottom at the one end of the first outer line 3a, and the other end (a lower end) thereof is connected to the top of the first grounding conductor 4a.

The connection conductor 6d is a conductor that electrically and mechanically connects the other end of the first outer line 3a and the second grounding conductor 4b. For example, the connection conductor 6d is a conductor extending in the Z-axis direction, one end (an upper end) thereof is connected to the bottom at the other end of the first outer line 3a, and the other end (a lower end) thereof is connected to the top of the second grounding conductor 4b.

The connection conductor 6e is a conductor that electrically and mechanically connects the one end of the second outer line 3b and the first grounding conductor 4a. For example, the connection conductor 6e is a conductor extending in the Z-axis direction, one end (an upper end) thereof is connected to the bottom at the one end of the second outer line 3b, and the other end (a lower end) thereof is connected to the top of the first grounding conductor 4a.

The connection conductor 6f is a conductor that electrically and mechanically connects the other end of the second outer line 3b and the second grounding conductor 4b. For example, the connection conductor 6f is a conductor extending in the Z-axis direction, one end (an upper end) thereof is connected to the bottom at the other end of the second outer line 3b, and the other end (a lower end) thereof is connected to the top of the second grounding conductor 4b.

The connection conductor 6g is a conductor that electrically and mechanically connects the other end of the signal line 1 and one end of the capacitor 5. For example, the connection conductor 6g is a conductor extending in the Z-axis direction, one end (an upper end) thereof is connected to the bottom at the other end of the signal line 1, and the other end (a lower end) thereof is connected to the one end of the capacitor 5.

The first electronic switch 7a is connected between the other end of the first inner line 2a and the second grounding conductor 4b. The first electronic switch 7a is, for example, an MOS field-effect transistor (FET), the drain terminal thereof is electrically connected to the other end of the first inner line 2a, the source terminal thereof is electrically connected to the second grounding conductor 4b, and the gate terminal thereof is electrically connected to the switch controller 8. For example, the size of the first electronic switch 7a is equal to or greater than the width of the second grounding conductor 4b.

The first electronic switch 7a is controlled so as to be an open state or a closed state on the basis of a gate signal input to the gate terminal thereof from the switch controller 8. The closed state is a state in which the drain terminal and the source terminal are electrically connected. The open state is a state in which the drain terminal and the source terminal are not electrically connected and the electrical connection therebetween is cut off. The first electronic switch 7a switches between either a connected state in which the other end of the first inner line 2a and the second grounding conductor 4b are electrically connected or a disconnected state in which the electrical connection therebetween is cut off under the control of the switch controller 8.

The second electronic switch 7b is connected between the other end of the second inner line 2b and the second grounding conductor 4b. The second electronic switch 7b is, for example, an MOS FET, the drain terminal thereof is electrically connected to the other end of the second inner line 2b, the source terminal thereof is electrically connected to the second grounding conductor 4b, and the gate terminal thereof is connected to the switch controller 8. For example, the size of the second electronic switch 7b is equal to or greater than the width of the second grounding conductor 4b.

The second electronic switch 7b is controlled so as to be the closed state or the open state on the basis of a gate signal input to the gate terminal thereof from the switch controller 8. The second electronic switch 7b switches between either a connected state in which the other end of the second inner line 2b and the second grounding conductor 4b are electrically connected or a disconnected state in which the electrical connection therebetween is cut off under the control of the switch controller 8.

The third electronic switch 7c is connected between the other end of the signal line 1 and the second grounding conductor 4b. The third electronic switch 7c is, for example, an MOS FET, the drain terminal thereof is connected to the other end of the signal line 1, the source terminal thereof is connected to the second grounding conductor 4b, and the gate terminal thereof is connected to the switch controller 8. In the example shown in FIG. 1, the third electronic switch 7c is provided at the other end side of the signal line 1, but without being limited thereto, the third electronic switch 7c may be provided at the one end side of the signal line 1.

The third electronic switch 7c is controlled so as to be the closed state or the open state on the basis of a gate signal input to the gate terminal thereof from the switch controller 8. The third electronic switch 7c switches between either a connected state in which the other end of the signal line 1 and the second grounding conductor 4b are electrically connected or a disconnected state in which the electrical connection therebetween is cut off under the control of the switch controller 8.

The fourth electronic switch 7d is connected in series to the capacitor 5 between the other end of the signal line 1 and the second grounding conductor 4b. The fourth electronic switch 7d is, for example, an MOS FET. In the example shown in FIG. 1, the drain terminal of the fourth electronic switch 7d is connected to the lower electrode of the capacitor 5, the source terminal thereof is connected to the second grounding conductor 4b, and the gate terminal thereof is connected to the switch controller 8.

The fourth electronic switch 7d is controlled so as to be the closed state or the open state on the basis of a gate signal input to the gate terminal thereof from the switch controller 8. The fourth electronic switch 7d switches between either a connected state in which the lower electrode of the capacitor 5 and the second grounding conductor 4b are electrically connected or a disconnected state in which the electrical connection therebetween is cut off under the control of the switch controller 8.

The switch controller 8 is a control circuit that controls the first electronic switch 7a, the second electronic switch 7b, the third electronic switch 7c, and the fourth electronic switch 7d which are a plurality of electronic switches 7. For example, the switch controller 8 includes four output ports. The switch controller 8 individually controls each of the plurality of electronic switches 7 to be switched to the open state or the closed state by outputting the individual gate signals from the output ports and supplying the gate signals to the gate terminals of the plurality of electronic switches 7.

Figure 2:
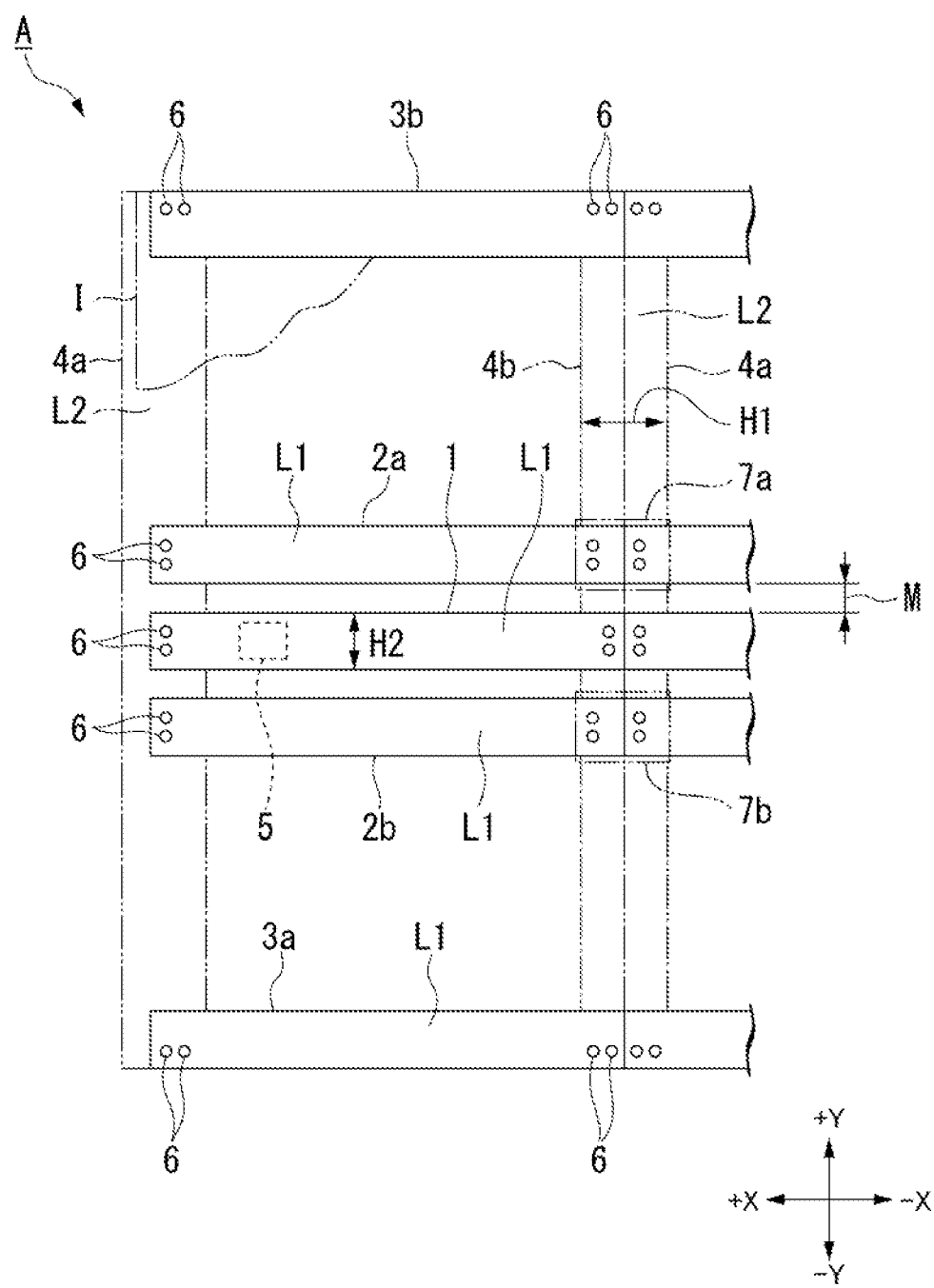
FIG. 2 is a schematic view of the digital phase shift circuit according to the embodiment viewed in a +Z direction.

FIG. 1 is a perspective schematic view showing the digital phase shift circuit A such that the mechanical structure of the digital phase shift circuit A can be easily understood, but an actual digital phase shift circuit A is formed as a multi-layered structure using semiconductor-manufacturing technology. FIG. 2 is a view of the digital phase shift circuit A according to this embodiment viewed in the +Z direction. In the example shown in FIG. 2, the plurality of electronic switches 7 and the switch controller 8 are omitted for the purpose of convenience of description.

For example, in the digital phase shift circuit A, the signal line 1, the first inner line 2a, the second inner line 2b, the first outer line 3a, and the second outer line 3b are formed in a first conductive layer L. The first grounding conductor 4a and the second grounding conductor 4b are formed in a second conductive layer L2 facing the first conductive layer L1 with an insulating layer I interposed therebetween. Components formed in the first conductive layer L1 and components formed in the second conductive layer L2 are connected to each other using via-holes. The plurality of connection conductors 6 corresponds to the via-holes buried in the insulating layer I. The positions, the number or the like of the via-holes are not limited to the configuration shown in FIG. 2.

Features of the digital phase shift circuit according to this embodiment will be described below. The inventor of the present invention found that a loss of a signal S increases as the frequency of the signal S increases and the loss of the signal S is due to the capacitance value Ca of a capacitor connected between a signal line and a second grounding conductor in the configuration example according to the related art. Therefore, the inventor of the present invention obtained an idea that a loss of a signal S can be decreased and a decrease in size can be achieved by decreasing the capacitance value Ca of the capacitor as much as possible for use in a higher frequency.

A delay amount in a digital phase shift circuit is proportional to the square root of the product of the inductance value L and the capacitance value C of the digital phase shift circuit. Accordingly, when the capacitance value Ca is decreased, the capacitance value C of the digital phase shift circuit decreases and thus a sufficient delay amount may not be able to be obtained. Therefore, the inventor of the present invention obtained an idea that it is possible to decrease a loss of a signal S while securing a sufficient delay amount and to achieve a decrease in size by increasing the inductance value L as the capacitance value Ca is decreased.

The present disclosure was made on the basis of the aforementioned ideas, and it is possible to decrease a loss of a signal S while securing a sufficient delay amount and to achieve a decrease in size by making the inner lines 2 closer to the signal line 1 to increase the inductance value L than the configuration according to the related art.

Figure 3:
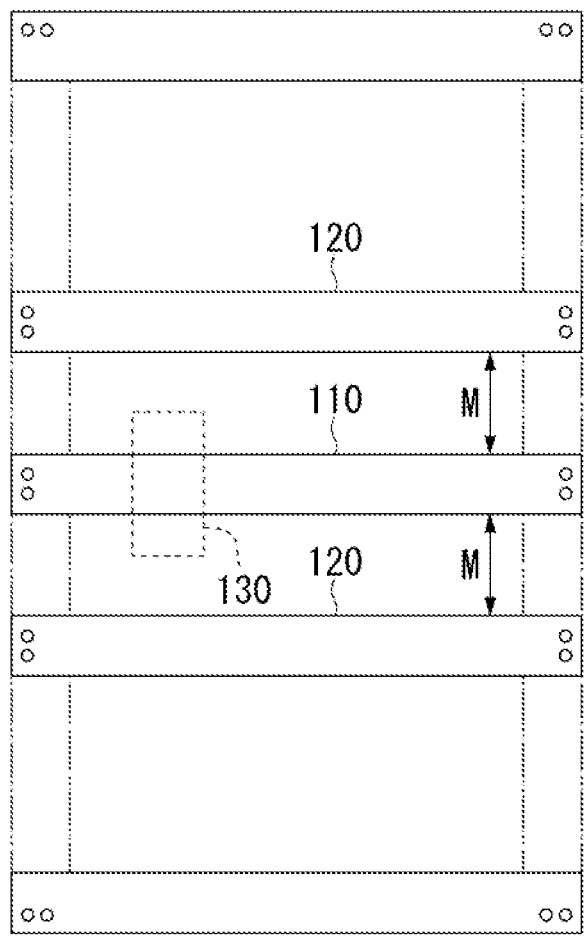
FIG. 3 is a schematic view of a digital phase shift circuit in the related art viewed in the +Z direction.

FIG. 3 is a schematic view of a digital phase shift circuit 100 according to the related art viewed in the +Z direction. In the digital phase shift circuit 100, the distance between a signal line 110 and each of inner lines 120 is set to be equal to or greater than 10 µm. In the digital phase shift circuit A according to this embodiment, the predetermined distance M is set to be less than that in the digital phase shift circuit 100 according to the related art. Accordingly, the capacitance value Ca of the capacitor 5 in this embodiment can be made to be less than that of a capacitor 130 shown in FIG. 3.

The decrease of the capacitance value Ca contributes to a decrease in size of the capacitor 5. For example, by setting the predetermined distance M to be less than 10 µm as shown in FIG. 2, the size of the capacitor 5 can be made to be equal to or less than the width H2 of the signal line 1.

Figure 4:
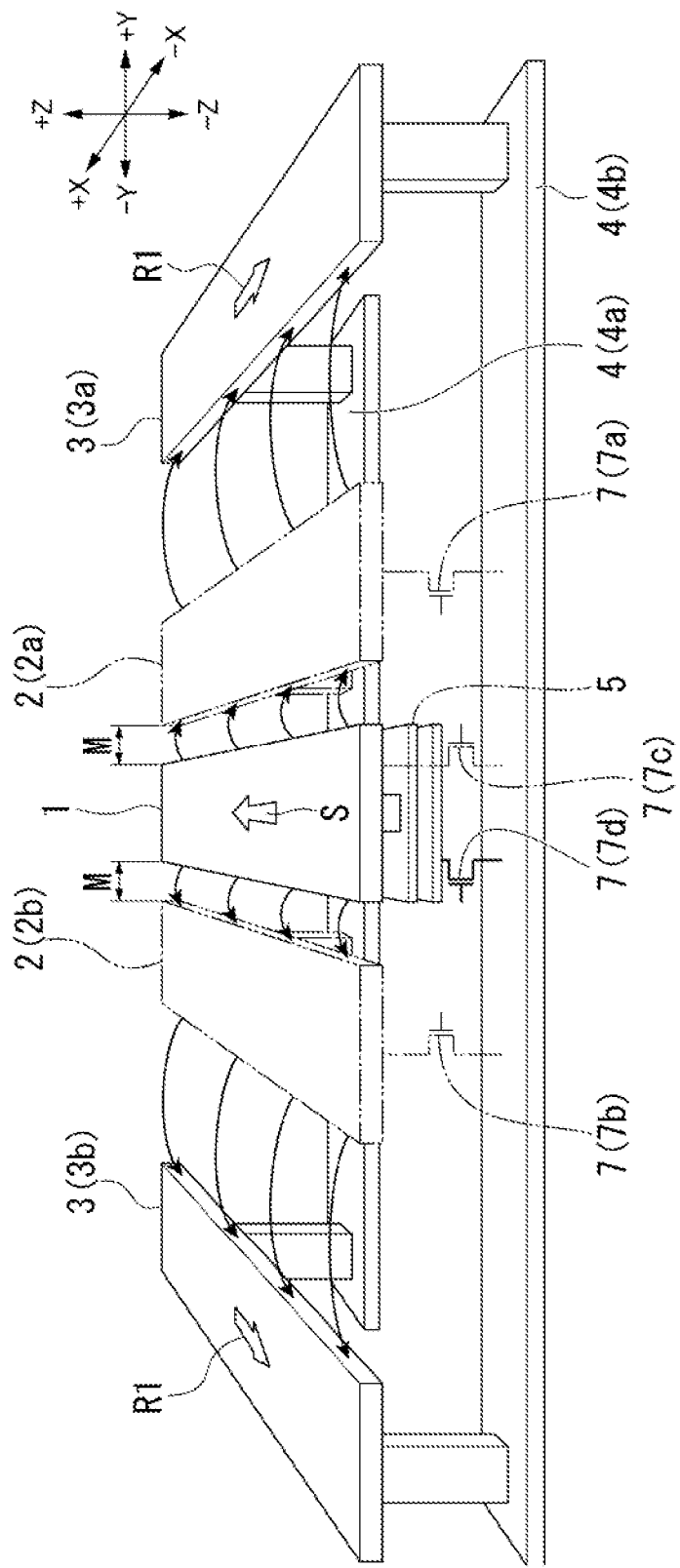
FIG. 4 is a diagram showing a high-delay mode according to the embodiment.

Operations of the digital phase shift circuit A according to this embodiment will be described below with reference to FIGS. 4 and 5. The digital phase shift circuit A includes a high-delay mode and a low-delay mode as an operation mode thereof. The digital phase shift circuit A operates in the high-delay mode or the low-delay mode.

(High-Delay Mode)

The high-delay mode is a mode in which a first phase difference is caused in a signal S. In the high-delay mode, as shown in FIG. 4, the first electronic switch 7a and the second electronic switch 7b are switched to the open state and the fourth electronic switch 7d is switched to the closed state.

By switching the first electronic switch 7a to the open state, electrical connection between the other end of the first inner line 2a and the second grounding conductor 4b is cut off. By switching the second electronic switch 7b to the open state, electrical connection between the other end of the second inner line 2b and the second grounding conductor 4b is cut off. By switching the fourth electronic switch 7d to the closed state, the other end of the signal line 1 is connected to the second grounding conductor 4b via the capacitor 5.

When a signal S is transmitted from an input end (the other end) to an output end (the one end) in the signal line 1, a return current R1 flows in a direction from the one end to the other end which is the reverse direction of the transmitting direction of the signal S. That is, the return current R1 is a current flowing in the −X direction which is the reverse direction of the transmitting direction of the signal S flowing in the +X direction. In the high-delay mode, since the first electronic switch 7a and the second electronic switch 7b are in the open state, the return current R1 flows mainly in the first outer line 3a and the second outer line 3b in the −X direction as shown in FIG. 4.

In the high-delay mode, since the return current R1 flows in the first outer line 3a and the second outer line 3b, the inductance value L is greater than that in the low-delay mode. In the high-delay mode, a larger delay amount than that in the low-delay mode can be obtained.

(Low-Delay Mode)

The low-delay mode is a mode in which a second phase difference smaller than the first phase difference is caused in a signal S. In the low-delay mode, as shown in FIG. 5, the first electronic switch 7a and the second electronic switch 7b are switched to the closed state and the fourth electronic switch 7d is switched to the open state.

By switching the first electronic switch 7a to the closed state, the other end of the first inner line 2a and the second grounding conductor 4b are electrically connected. By switching the second electronic switch 7b to the closed state, the other end of the second inner line 2b and the second grounding conductor 4b are electrically connected.

Figure 5:
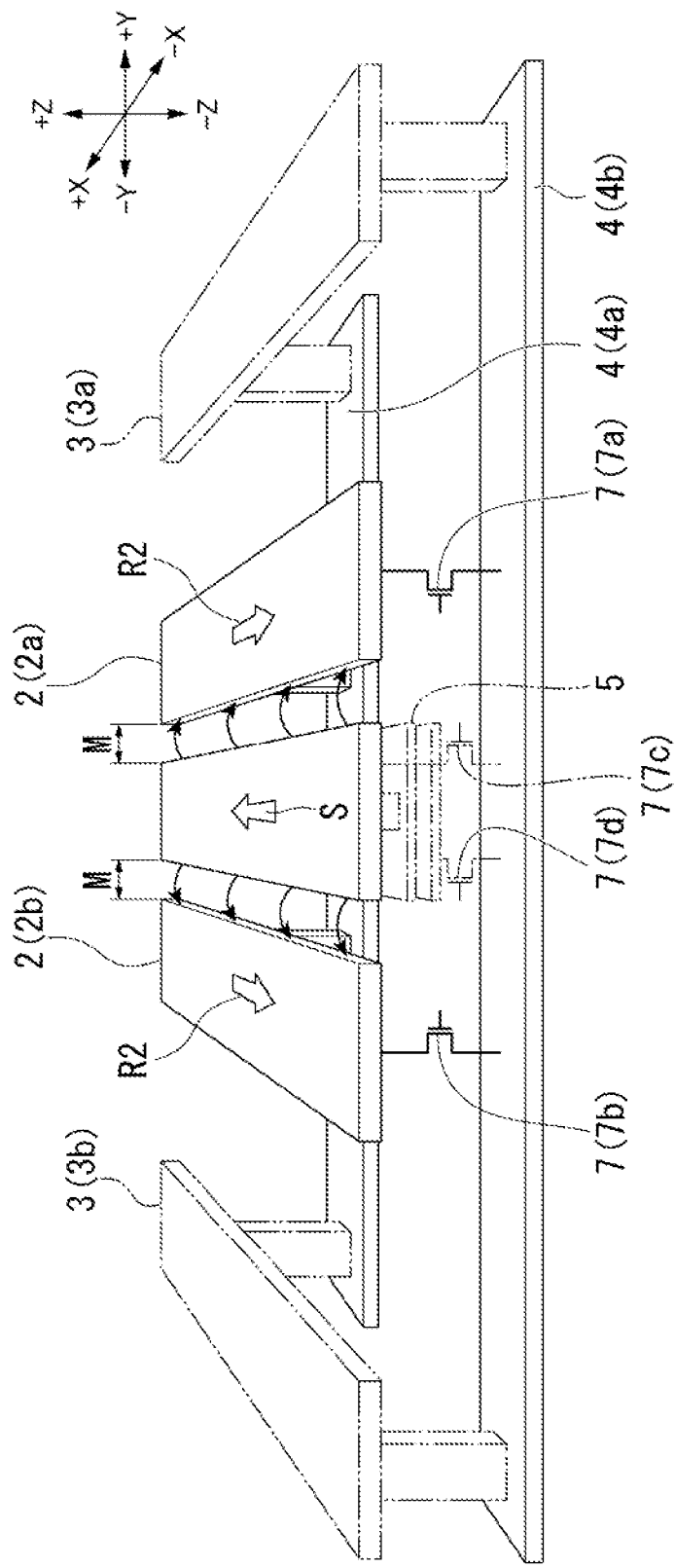
FIG. 5 is a diagram showing a low-delay mode according to the embodiment.

In the low-delay mode, since the first electronic switch 7a and the second electronic switch 7b are in the closed state, a return current R2 flows mainly in the first inner line 2a and the second inner line 2b in the −X direction as shown in FIG. 5. In the low-delay mode, since the return current R2 flows in the first inner line 2a and the second inner line 2b, the inductance value L is less than that in the high-delay mode. The delay amount in the low-delay mode is smaller than the delay amount in the high-delay mode.

The first inner line 2a and the second inner line 2b in this embodiment are closer to the signal line 1 than the configuration according to the related art. Accordingly, in the low-delay mode according to this embodiment, the inductance value L is greater than that in the low-delay mode with the configuration according to the related art. As a result, it is possible to further decrease the capacitance value Ca of the capacitor 5 than that of the related art.

Figure 6:
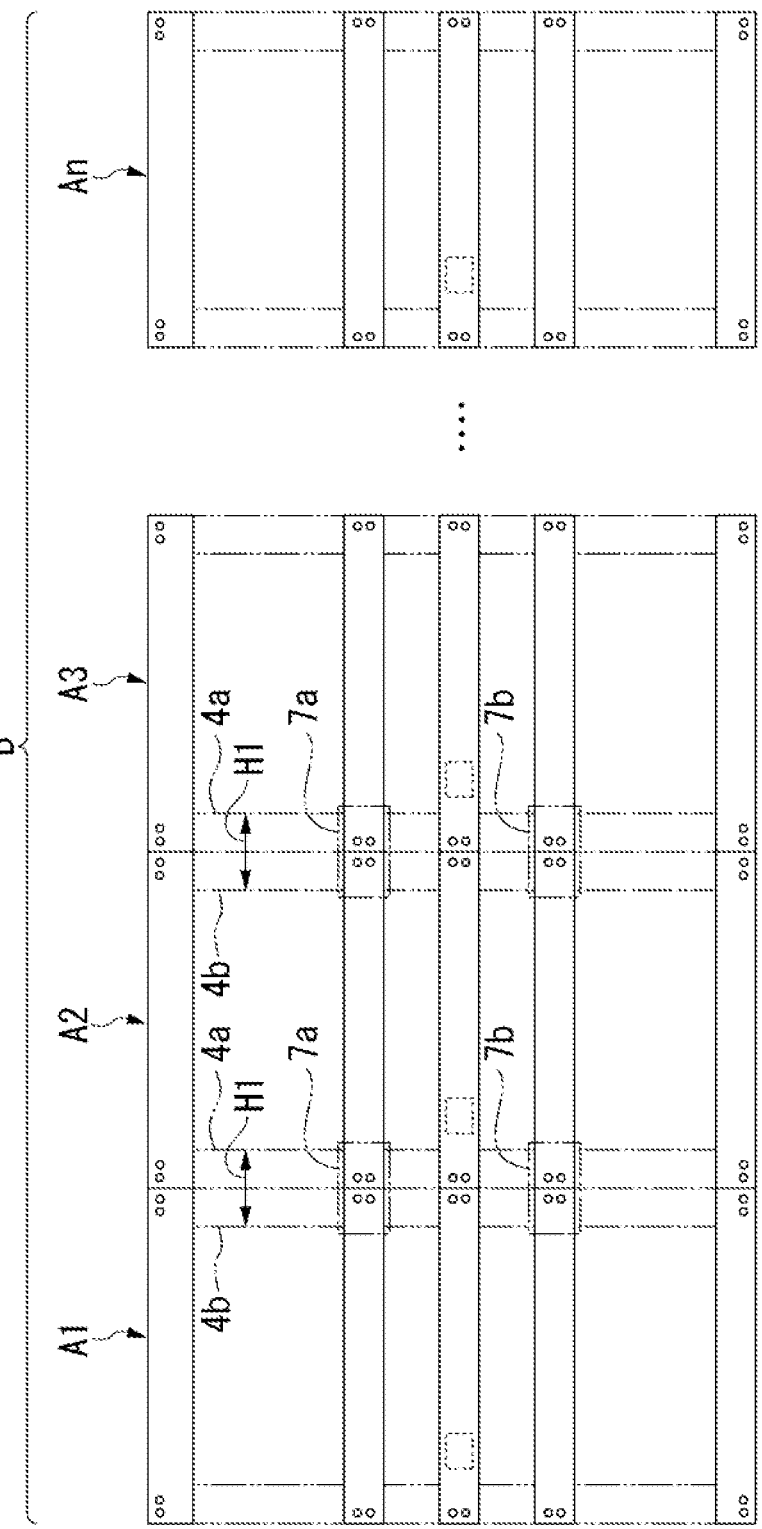
FIG. 6 is a diagram schematically showing a configuration of a digital phase shifter according to the embodiment.

A digital phase shifter B according to this embodiment will be described below with reference to FIG. 6. FIG. 6 is a diagram schematically showing a configuration of a digital phase shifter B according to this embodiment. The digital phase shifter B includes n (where n is an integer equal to or greater than 2) digital phase shift circuits A which are connected in a cascade manner. The digital phase shifter B shifts a phase of a signal S in a predetermined frequency band (hereinafter referred to as a "used frequency band") using the n digital phase shift circuits A connected in a cascade manner. The used frequency band ranges from a first frequency f1 to a second frequency 2 higher than the first frequency.

The digital phase shifter B can allow each of the n digital phase shift circuits A to operate in either one of the low-delay mode and the high-delay mode. Accordingly, the digital phase shifter B can control a delay amount of a signal S by controlling the operation mode of each of the n digital phase shift circuits A in the low-delay mode or the high-delay mode.

For example, in the digital phase shifter 1B, among the n digital phase shift circuits A connected in a cascade manner, the first to i-th digital phase shift circuits A operate in the low-delay mode and the (i+1)-th to n-th digital phase shift circuits A operate in the high-delay mode. In the digital phase shifter B, a delay control state can be switched by arbitrarily changing the value of i. The delay control state indicates a control state of the operation modes of the n digital phase shift circuits A and indicates, for example, the first to what number of the digital phase shift circuits among the n digital phase shift circuits A connected in a cascade manner are in the high-delay mode or the low-delay mode.

When n is 46, 47 delay control states in which the value of i is 0, 1 . . . , 46 can be considered. For example, the delay control state when the value of i is 0 indicates a case in which all the n digital phase shift circuits A are in the high-delay mode. For example, the delay control state when the value of i is 46 indicates a case in which all the n digital phase shift circuits Aare in the low-delay mode.

In the digital phase shifter B, a magnitude relationship in signal amplitude of a signal S in the delay control states may be set to differ between when the frequency of the signal S is the first frequency f1 and when the frequency of the signal S is the second frequency f2. That is, the magnitude relationship in amplitude of the signal S varying according to the control state of the operation modes of the plurality of digital phase shift circuits A may be set to differ between when the frequency of the signal S is the first frequency f1 and when the frequency of the signal S is the second frequency f2.

A magnitude relationship between an amplitude of a signal S when all the n digital phase shift circuits A are in the low-delay mode and an amplitude of the signal S when all the n digital phase shift circuits A are in the high-delay mode may be set to differ between when the frequency of the signal S is the first frequency f1 and when the frequency of the signal S is the second frequency f2.

As described above, the digital phase shift circuit A according to this embodiment includes the signal line 1, the two inner lines 2, the two outer lines 3, the first grounding conductor 4a, the second grounding conductor 4b, the first electronic switch 7a, and the second electronic switch 7b. The inner lines 2 are disposed on both one side and the other side of the signal line 1 and are separated a predetermined distance M from the signal line 1. The predetermined distance M is set to be less than 10 μm and is more preferably set to be equal to or less than 2 μm.

With this configuration, it is possible to decrease the size of the capacitor 5, which contributes to a decrease in size. For example, a size (a size in the Y-axis direction) of the upper electrode of the capacitor 5 according to this embodiment is equal to or less than the width H2 of the signal line 1. Since the capacitance value Ca of the capacitor 5 can be decreased, it is possible to decrease a loss of a signal S.

Figure 7:
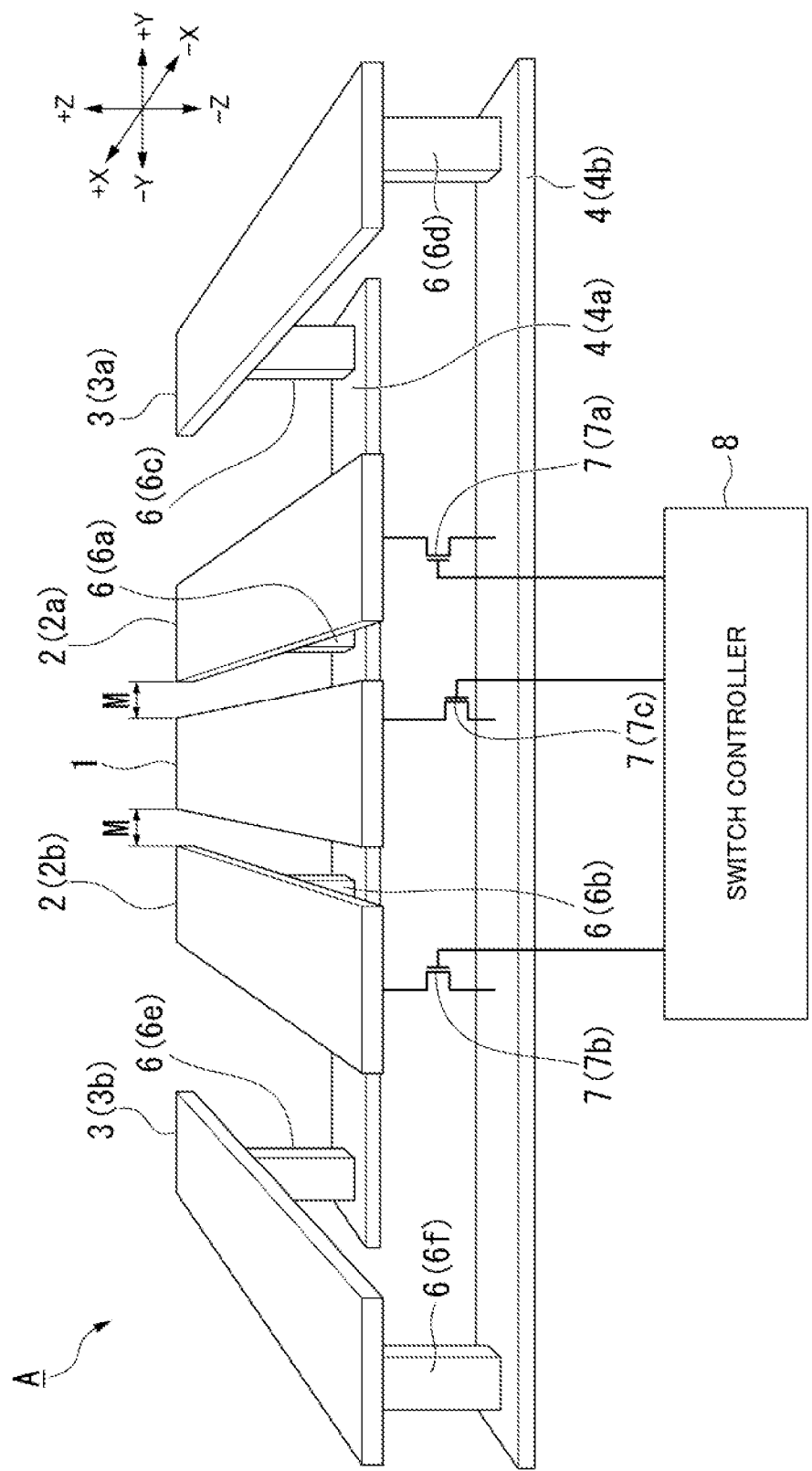
FIG. 7 is a diagram showing a first modification of the digital phase shift circuit according to the embodiment.

The aforementioned digital phase shift circuit A includes the capacitor 5, but the present invention is not limited thereto and the capacitor 5 may not be provided therein. That is, in the digital phase shift circuit A, since the signal line 1 and each of the inner lines 2 are made to be closer to each other than in the related art, a configuration in which the capacitor 5 and the third electronic switch 7c are not provided as shown in FIG. 7 can be adopted.

In the high-delay mode, a loss of a signal S is greater than that in the low-delay mode. Accordingly, in the digital phase shifter B in which a plurality of digital phase shift circuits Aare connected in a cascade manner, a case in which the loss of the signal S increases as the delay amount increases is conceivable. That is, the loss (a signal amplitude) of the signal S may change due to the phase shift amount. In the digital phase shift circuit A, the first grounding conductor 4a and the second grounding conductor 4b positioned outside of the inner lines 2 may be formed in a multi-layered structure in order to reduce unbalance in signal amplitude between the high-delay mode and the low-delay mode.

Figure 8:
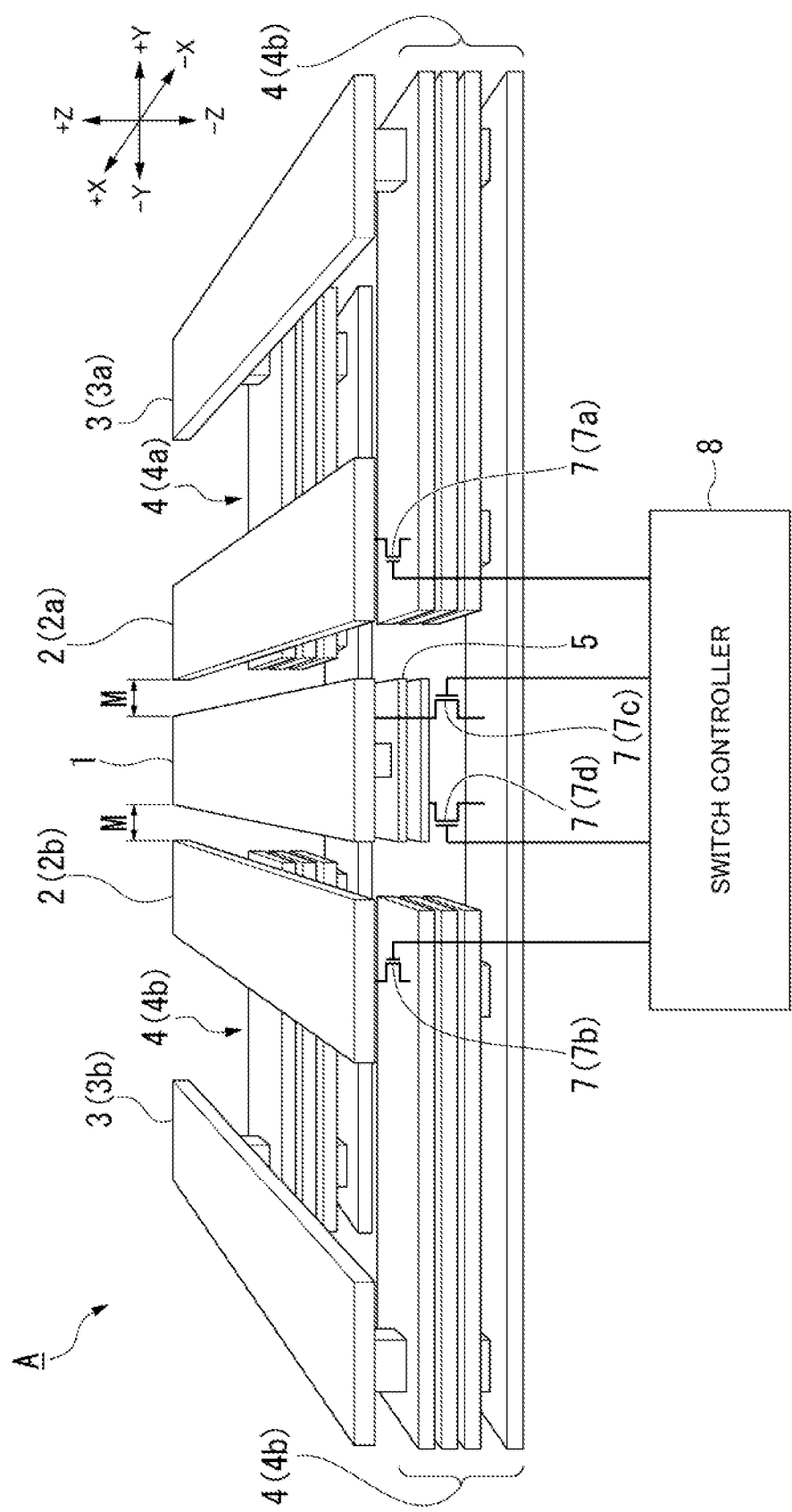
FIG. 8 is a diagram showing a second modification of the digital phase shift circuit according to the embodiment.

For example, as shown in FIG. 8, parts of the first grounding conductor 4a and the second grounding conductor 4b corresponding to areas between the outer lines 3 and the inner lines 2 may be formed in a multi-layered structure. The parts corresponding to the areas between the outer lines 3 and the inner lines 2 include a part between the first outer line 3a and the first inner line 2a and a part between the second outer line 3b and the second inner line 2b. The present invention is not limited thereto, and parts of either one of the first grounding conductor 4a and the second grounding conductor 4b corresponding to the areas between the outer lines 3 and the inner lines 2 may be formed in a multi-layered structure.

With this configuration, it is possible to decrease the resistance value of the grounding conductors 4 between the outer lines 3 and the inner lines 2 and to decrease a loss of a signal S in the high-delay mode. Accordingly, it is possible to reduce unbalance in signal amplitude between the high-delay mode and the low-delay mode.

In the digital phase shift circuit A according to this embodiment, a size (a size in the X-axis direction) of each of the first electronic switch 7a and the second electronic switch 7b may be set to be equal to or greater than a length H1 obtained by summing the width of the second grounding conductor 4b and the width of the first grounding conductor 4a. The size of each of the first electronic switch 7a and the second electronic switch 7b may be set to be equal to or greater than the width H1 shown in FIG. 6. More preferably, the size of each of the first electronic switch 7a and the second electronic switch 7b is set to be equal to the width H1 or to be slightly greater than the width 1. Here, for example, a loss of a signal S in the low-delay mode is mainly due to resistance components (on-resistance components) when the first electronic switch 7a and the second electronic switch 7b are in the closed state.

Accordingly, in order to reduce unbalance in signal amplitude between the high-delay mode and the low-delay mode, a field-effect transistor with a loss equal to the sum of the loss due to the capacitor 5 and the resistance loss due to a current path of a return current in the high-delay mode may be used as the first electronic switch 7a and the second electronic switch 7b. The resistance value and the channel width of a field-effect transistor, that is, the size of the field-effect transistor, have a correlation. For example, when the size of a field-effect transistor is about the length H1, the resistance loss due to the field-effect transistor is equal to the sum of the loss due to the capacitor 5 and the resistance loss of the current path of the return current in the high-delay mode.

The digital phase shift circuit A may include a third electronic switch 7c that is connected between the signal line 1 and the first grounding conductor 4a or the second grounding conductor 4b. For example, in the low-delay mode, the loss in the signal line 1 is intentionally increased by setting the third electronic switch 7c to the closed state (an ON state). This application of a loss is for making the loss caused in a high-frequency signal in the low-delay mode equal to the loss caused in the high-frequency signal in the high-delay mode. For example, in the high-delay mode, by setting the third electronic switch 7c to the open state (an OFF state), an operation for intentionally increasing the loss in the signal line 1 is not performed. As a result, the loss caused in a high-frequency signal in the high-delay mode is equal to the loss caused in the high-frequency signal in the low-delay mode.

While the present invention has been described above with reference to a suitable embodiment, the present invention is not limited to the aforementioned embodiment and can be modified in various forms within the scope of the present invention. For example, the signal line 1 may be formed in a first conductive layer, and the inner lines 2 may be formed in a second conductive layer facing the first conductive layer with an insulating layer interposed therebetween.

DESCRIPTION OF REFERENCE NUMERALS

1 Signal line
2 Inner line
2a First inner line
2b Second inner line
3 Outer line
3a First outer line
3b Second outer line
4 Grounding conductor
4a First grounding conductor
4b Second grounding conductor
5 Capacitor
6 Connection conductor
7 Electronic switch
7a First electronic switch
7b Second electronic switch
7c Third electronic switch
7d Fourth electronic switch
8 Switch controller

The invention claimed is:

1. A digital phase shift circuit comprising:
a signal line extending in a predetermined direction;
two inner lines disposed on both one side and the other side of the signal line and separated a predetermined distance from the signal line;
two outer lines provided at positions which are farther from the signal line than the inner lines on both the one side and the other side;
a first grounding conductor electrically connected to one end of each of the inner lines and the outer lines;
a second grounding conductor electrically connected to other ends of the outer lines;
a first electronic switch connected between another end of an inner line of the inner lines on the one side and the second grounding conductor;
a second electronic switch connected between another end of an inner line of the inner lines on the other side and the second grounding conductor,
a capacitor connected between the signal line and the second grounding conductor; and
a fourth electronic switch connected in series to the capacitor,
wherein the predetermined distance is set to be less than 10 μm, and
a size of an upper electrode of the capacitor is equal to or less than a width of the signal line.

2. The digital phase shift circuit according to claim 1, wherein the predetermined distance is set to be equal to or less than 2 μm.

3. The digital phase shift circuit according to claim 1, comprising a third electronic switch connected between the signal line and the first grounding conductor or the second grounding conductor.

4. The digital phase shift circuit according to claim 1, wherein parts of both or one of the first grounding conductor and the second grounding conductor, which correspond to areas between the outer lines and the inner lines, are formed in a multi-layered structure.

5. The digital phase shift circuit according to claim 1, wherein the signal line is formed in a first conductive layer, and
wherein the inner lines are formed in a second conductive layer facing the first conductive layer with an insulating layer interposed therebetween.

6. A digital phase shifter comprising:
a plurality of the digital phase shift circuits according to claim 1 connected in a cascade manner,
wherein a signal in a frequency band from a first frequency to a second frequency higher than the first frequency is shifted in phase by the plurality of digital phase shift circuits connected in a cascade manner,
wherein each of the plurality of digital phase shift circuits operates in either one operation mode of a low-delay mode in which the first electronic switch and the second electronic switch are set to a closed state and a high-delay mode in which the first electronic switch and the second electronic switch are set to an open state, and
wherein a magnitude relationship of the signal varying according to a control state of operation modes of the plurality of digital phase shift circuits differs between when a frequency of the signal is the first frequency and when the frequency of the signal is the second frequency.

7. A digital phase shifter comprising:
a plurality of the digital phase shift circuits according to claim 1 connected in a cascade manner,
wherein a signal in a frequency band from a first frequency to a second frequency higher than the first frequency is shifted in phase by the plurality of digital phase shift circuits connected in a cascade manner,
wherein each of the plurality of digital phase shift circuits operates in either one operation mode of a low-delay mode in which the first electronic switch and the second electronic switch are set to a closed state and a high-delay mode in which the first electronic switch and the second electronic switch are set to an open state, and
wherein a magnitude relationship between an amplitude of the signal when all the plurality of digital phase shift circuits are in the low-delay mode and an amplitude of the signal when all the plurality of digital phase shift circuits are in the high-delay mode differs between when a frequency of the signal is the first frequency and when the frequency of the signal is the second frequency.

8. A digital phase shift circuit comprising:
a signal line extending in a predetermined direction;
two inner lines disposed on both one side and the other side of the signal line and separated a predetermined distance from the signal line;

two outer lines provided at positions which are farther from the signal line than the inner lines on both the one side and the other side;
a first grounding conductor electrically connected to one end of each of the inner lines and the outer lines a second grounding conductor electrically connected to other ends of the outer lines;
a first electronic switch connected between another end of an inner line of the inner lines on the one side and the second grounding conductor; and
a second electronic switch connected between another end of an inner line of the inner lines on the other side of the second grounding conductor,
wherein the predetermined distance is set to be less than 10 μm,
wherein the first electronic switch and the second electronic switch are field-effect transistors, and
wherein a size of each of the field-effect transistors is equal to or greater than a length obtained by summing a width of the first grounding conductor and a width of the second grounding conductor.

* * * * *